US011222826B2

(12) United States Patent
Huang et al.

(10) Patent No.: US 11,222,826 B2
(45) Date of Patent: Jan. 11, 2022

(54) FINFET STRUCTURE AND DEVICE

(71) Applicant: Taiwan Semiconductor Manufacturing Company, Ltd., Hsinchu (TW)

(72) Inventors: Yen-Chun Huang, New Taipei (TW); Chih-Tang Peng, Zhubei (TW); Kuang-Yuan Hsu, Taichung (TW); Tai-Chun Huang, Hsinchu (TW); Tsu-Hsiu Perng, Zhubei (TW); Tien-I Bao, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/685,758

(22) Filed: Nov. 15, 2019

(65) Prior Publication Data
US 2020/0083109 A1    Mar. 12, 2020

Related U.S. Application Data

(62) Division of application No. 15/280,703, filed on Sep. 29, 2016, now Pat. No. 10,483,169.

(51) Int. Cl.
*H01L 21/8234* (2006.01)
*H01L 21/762* (2006.01)
*H01L 27/088* (2006.01)

(52) U.S. Cl.
CPC ........... *H01L 21/823481* (2013.01); *H01L 21/76224* (2013.01); *H01L 21/76232* (2013.01); *H01L 21/823431* (2013.01); *H01L 27/0886* (2013.01)

(58) Field of Classification Search
CPC .............................. H01L 21/823431
See application file for complete search history.

(56) References Cited

U.S. PATENT DOCUMENTS

| 8,617,996 | B1 | 12/2013 | Chi et al. |
| 9,318,342 | B2* | 4/2016 | Xie .................. H01L 29/0692 |
| 9,805,984 | B2 | 10/2017 | Yin et al. |
| 2015/0279971 | A1 | 10/2015 | Xie et al. |
| 2015/0340238 | A1 | 11/2015 | Xie et al. |
| 2015/0357439 | A1 | 12/2015 | Liu et al. |
| 2016/0035874 | A1 | 2/2016 | Lin et al. |
| 2018/0090491 | A1 | 3/2018 | Huang et al. |

FOREIGN PATENT DOCUMENTS

| CN | 103474397 A | 12/2013 |
| CN | 104103570 A | 10/2014 |

* cited by examiner

*Primary Examiner* — Yu-Hsi D Sun
(74) *Attorney, Agent, or Firm* — Slater Matsil, LLP

(57) ABSTRACT

A cut-last process for cutting fin segments of a FinFET structure on a substrate utilizes a two-step process. After the fins are formed, an oxide material is deposited in the trenches of the FinFET structure. The oxide material can be an STI oxide or a low-stress dummy gapfill material. A fin segment can be removed by an etchant and can leave a concave shaped (such as a u-shape or v-shape) portion of silicon at the bottom of the fin. Where the oxide material is an STI oxide, the void left by removing the fin can be filled with replacement STI oxide. Where the oxide material is a dummy gapfill material, the dummy gapfill material can be removed and replaced with an STI oxide or converted to an STI oxide and filled with replacement STI oxide before or after the conversion.

20 Claims, 8 Drawing Sheets

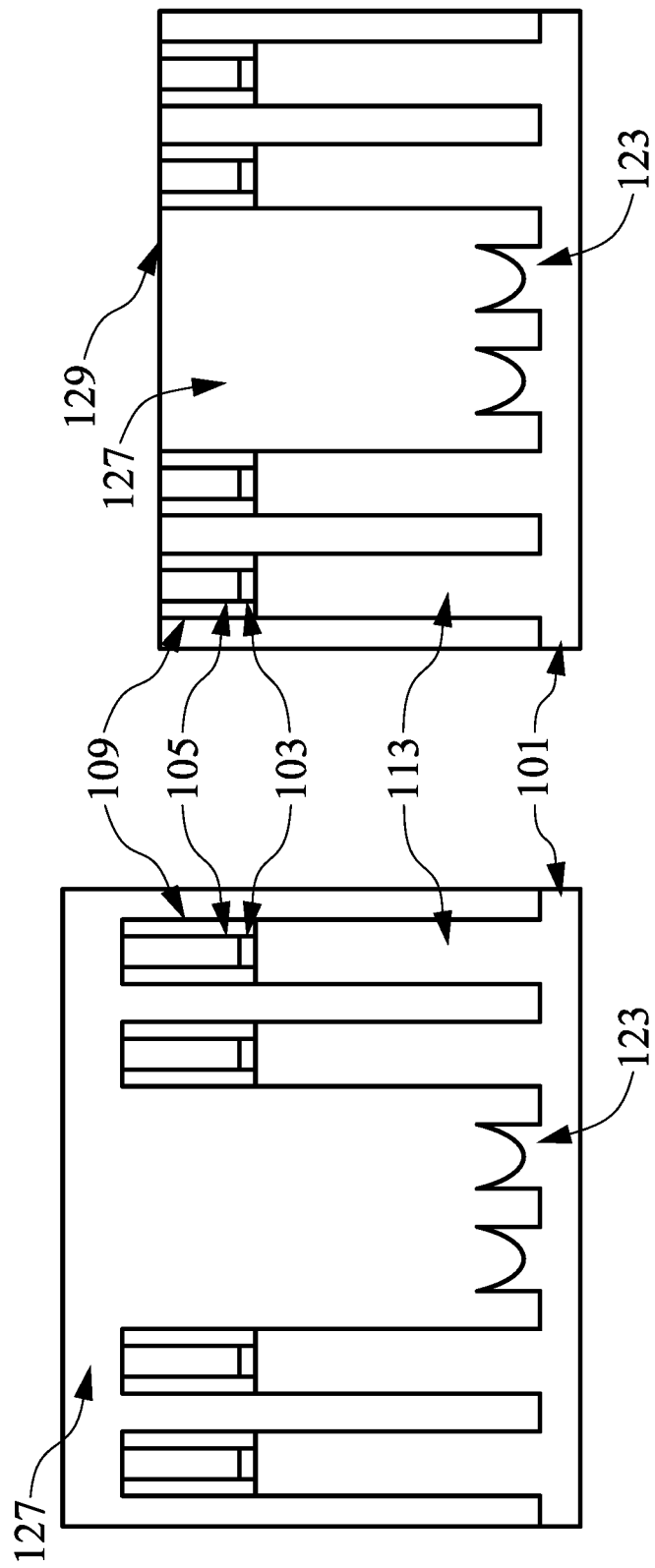

FINFET STRUCTURE AND DEVICE

PRIORITY CLAIM AND CROSS-REFERENCE

This application is a divisional of U.S. patent application Ser. No. 15/280,703, entitled "FinFET Cut-Last Process Using Oxide Trench Fill," filed on Mar. 29, 2018, which application is incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins. Although existing FinFET devices and methods of fabricating FinFET devices have been generally adequate for their intended purposes, they have not been entirely satisfactory in all respects. For example, a more flexible integration for forming fin and isolation structures is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-15 illustrate cross-sectional views of intermediate stages in the manufacturing of Fin Field-Effect Transistors (FinFETs) using a cut-last process, in accordance with some embodiments.

DETAILED DESCRIPTION

Figure 1:
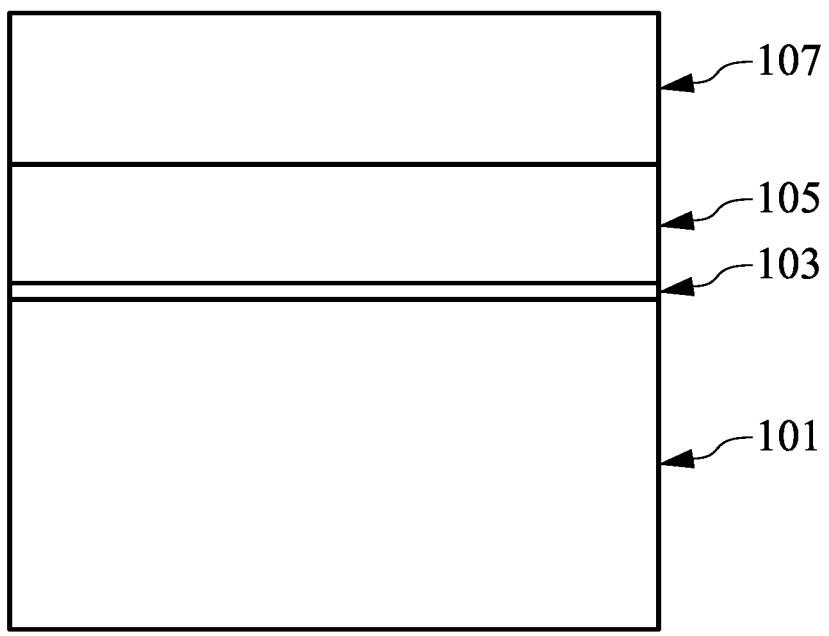

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Cut-last Fin Field-Effect Transistors (FinFETs) and the methods of forming the same are provided. The intermediate stages in the formation of the cut-last FinFETs are illustrated in accordance with exemplary embodiments. Some variations of some embodiments are discussed. Throughout the various views and illustrative embodiments, like reference numbers are used to designate like elements.

FIGS. 1-15 illustrate the cross-sectional views of intermediate stages in the formation of a cut-last FinFET in accordance with some embodiments.

A FinFET structure on a bulk substrate can be processed to create individual transistors by removing or separating fins. A cut-first formation can cut the fins prior to recessing the substrate material, so that fins are never fully formed in the cut-first area. Critical dimension (CD) loading during fin etch can be an issue in cut-first processing. In a cut-last formation process, fins can be created on a substrate and then removed or separated in accordance with a desired oxide definition (OD) transistor design. During the lithography process of a cut-last process, critical dimension uniformity (CDU) overlay (OVL) can be a problem as fin technology goes smaller and smaller sizes. If cut-last process can be implemented, i.e., the lithography is available, then cut-last will be preferred over cut-first. In general, it is desirable to use a cut-last process for cost and manufacture benefits. Using a cut-last process, as described herein, can allow manufacturers to reduce the size of the cuts or gaps in the formed patterns. This reduction of size in turn allows forming patterns and features with higher density. For example, the method described above may lead to smaller SRAM cell size and, therefore, to increased SRAM cell density in a SRAM device.

As FinFET fin sizes decrease with smaller layout technologies, it can become difficult to perform a cut-last process at small fin sizes (e.g., width) and pitches (or spacing). For example, where a FinFET layout includes a fin pitch of less than 25 nm, using traditional cut-last processes can be problematic. (Fin pitch includes the width of the fin plus the spacing to the next fin, in plan view.) Also, manufacturing variances can inhibit cut-last strategies. Typically, a cut-last process will cut fins after the fins have been formed. A photoresist mask can be deposited and patterned to be over the fins that are not to be cut and expose the fins to be cut. Then the exposed fins can be etched away. However, using a photoresist is more difficult as fin sizes and pitches decrease.

One embodiment uses a cut-last process that first stabilizes the fins to be cut and the fins proximate to the fins to be cut by including an STI oxide between each of the fins. With the STI oxide in place, individual fins can be fine cut at the top to expose the fins from the STI oxide or other fin capping structures and then etched away using a self-aligned etch (with the STI oxide as a mask). Once the fins are etched away, STI oxide can be added to the voids left by the removal of the fins or fin portions. This two-step process can allow fins to be cut-last where fin sizes are becoming smaller and smaller. Embodiments of the present disclosure provide a two-step cut-last process to remove fins (or portions of fins) from a FinFET structure.

When removing or separating fins (i.e., cutting fins) of the FinFET structure, however, fin bending can occur proximate to where the fins are removed or separated. Permanent STI oxide is typically high stress and can provide pressure on fins at the edges of the OD. When cutting and removing fins, then replacing STI oxide, the high stress can cause fin bending (inclining the fins from the vertical about a bending moment) proximate to the fins being cut and removed and proximate to edges of the OD areas. Where the fins bend, nearby fins can also bend because the high stress STI oxide can transfer the bend from one fin to the next. Some embodiments of the present disclosure help prevent fin bending from occurring in a cut-last formation process by using a low stress dummy gapfill material instead of STI oxide. This will be explained in further detail below.

FIG. 1 illustrates a FinFET semiconductor structure at an early stage of production. Semiconductor substrate 101 is part of a semiconductor wafer. In accordance with some embodiments of the present disclosure, semiconductor substrate 101 includes crystalline silicon. Other materials that can be used in the substrate 101 include carbon, germanium, gallium, boron, arsenic, nitrogen, indium, and/or phosphorus, and the like. Semiconductor substrate 101 may also include other semiconductor materials such as III-V compound semiconductor materials. Semiconductor substrate 101 can be a bulk substrate or a Semiconductor-on-Insulator (SOI) substrate. Furthermore, the substrate 101 may include other features. For example, the substrate may include various doped regions depending on design requirements (e.g., p-type substrate or n-type substrate). For example, the doped regions may be doped with p-type dopants, such as boron or $BF_2$, n-type dopants, such as phosphorus or arsenic, and/or combinations thereof. The doped regions may be configured for an n-type FinFET, or alternatively configured for a p-type FinFET.

Pad oxide layer 103, pad nitride layer 105, and hard mask layer 107 are formed on semiconductor substrate 101. Pad oxide layer 103 may be a thin film comprising silicon oxide. In some embodiments, pad oxide layer 103 is formed in a thermal oxidation process, wherein a top surface layer of semiconductor substrate 101 is oxidized. Pad oxide layer 103 can act as an adhesion layer between semiconductor substrate 101 and pad nitride layer 105. Pad oxide layer 103 can also act as an etch stop layer for etching pad nitride layer 105. Pad nitride layer 105 can be a first hard mask layer. Pad nitride layer 105 can be made of hard mask materials such as silicon nitride (SiN). In some embodiments, pad nitride layer 105 can be formed using Low-Pressure Chemical Vapor Deposition (LPCVD). In other embodiments, mask layer 105 can be formed by thermal nitridation of silicon, Plasma Enhanced Chemical Vapor Deposition (PECVD), or plasma anodic nitridation. Hard mask layer 107 can be a second hard mask layer and can be made of the same material as pad nitride layer 105 or a different material from that used in pad nitride layer 105. Hard mask layer 107 can be considered an Oxide Definition (OD) resist layer. Hard mask layer 107 can be made using the same technique as pad nitride layer 105 or a different technique from pad nitride layer 105. The combination of the pad oxide layer 103, pad nitride layer 105, and hard mask 107 can be used as a hard mask during subsequent photolithography processes.

Figure 2:
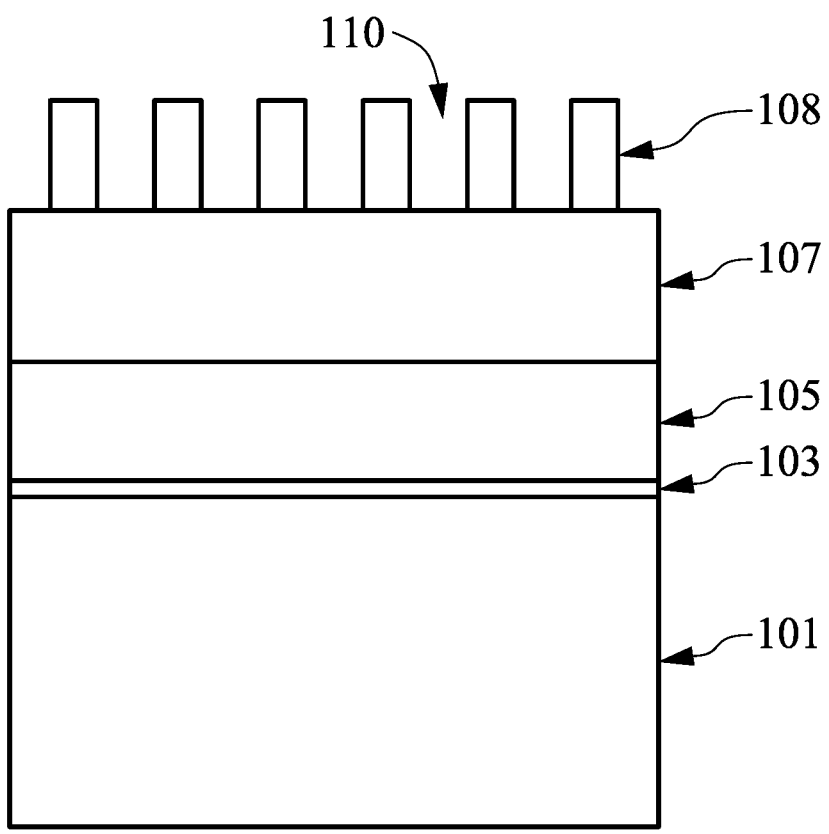

FIG. 2 illustrates the addition of a photoresist layer 108 that is added on top of hard mask 107 and then patterned according to the OD, where the fins of the FinFET will be located, thereby forming openings 110 in photo resist 108. In some embodiments photoresist layer 108 can be considered an OD resist layer. Generally, photolithography techniques utilize a photoresist material (such as photo resist 108) that is deposited, irradiated (exposed), and developed to remove a portion of the photoresist material. The remaining photoresist material protects the underlying material, such as the hard mask layer in this example, from subsequent processing steps, such as etching. In this example, the photoresist material is patterned to define the pad oxide layer 103, pad nitride layer 105, and hard mask 107.

Figure 3:
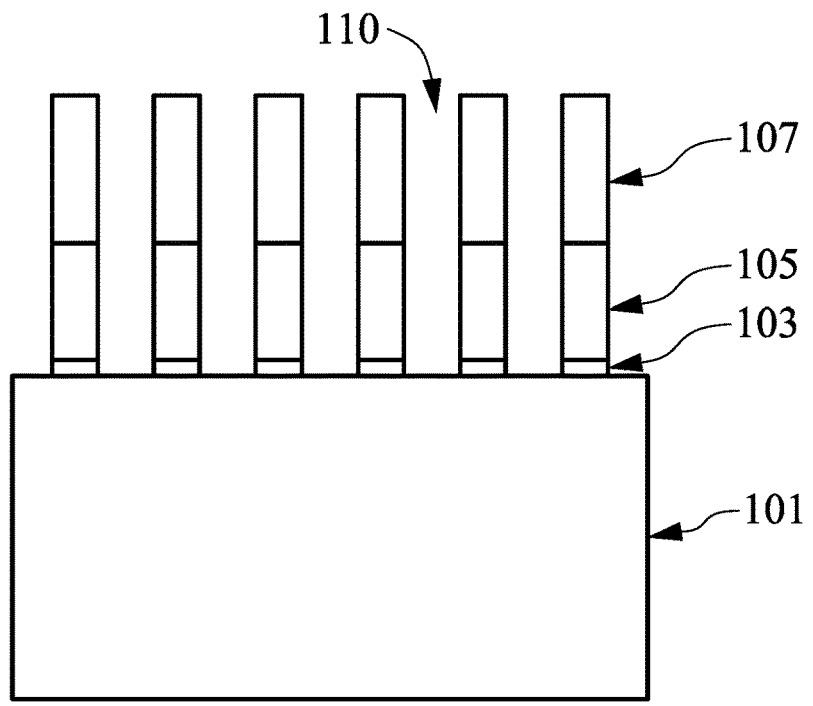

Referring to FIG. 3, hard mask 107, pad nitride layer 105, and pad oxide layer 103 are etched, exposing underlying semiconductor substrate 101. Photoresist layer 108 can be removed. Although illustrated as rectangular, the pad oxide layer 103, pad nitride layer 105, and hard mask 107 can have a taper to them, being narrower at the top than the bottom in each subsequent layer.

Figure 4:
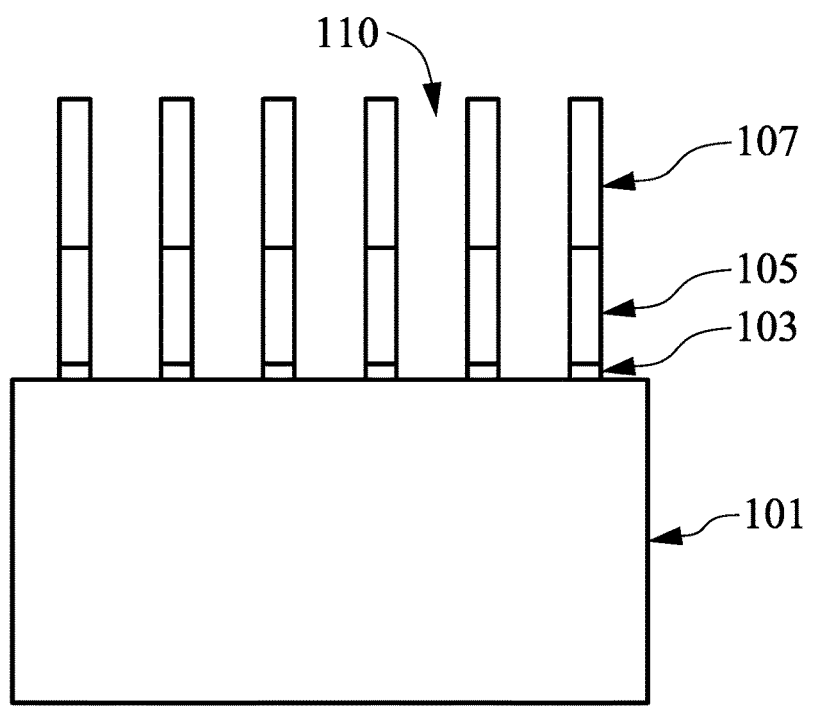

Referring to FIG. 4, an optional trimming process can be done to trim pad oxide 103, mask 105, and hard mask 107. The trimming process can thin the overall width of each of these structures. In some embodiments the trimming process can be provided by a plasma etch using, for example, a reactive ion etch (RIE) or atomic layer etching (ALE) to shape trim pad oxide 103, mask 105, and hard mask 107. The trimming can be done in one or more steps.

Figure 5:
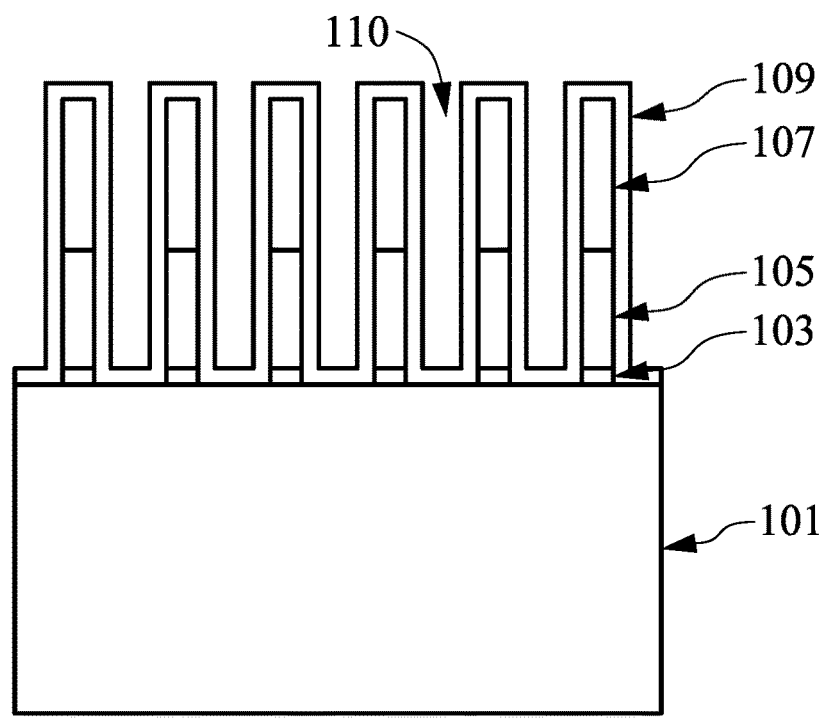

FIG. 5 illustrates an optional re-capping process that can be done to expand the width of the fin tips defined by pad oxide 103, pad nitride 105, and hard mask 107. An oxide can be deposited over the structure to form a re-capping oxide layer 109. Oxide layer 109 can be a conformal layer whose horizontal portions and vertical portions have thicknesses that are close to each other. In some embodiments, oxide layer 109 can be formed using a deposition technique such as Atomic Layer Deposition (ALD) or Sub Atomic Chemical Vapor Deposition (SACVD). For example, a suitable re-capping oxide material is an ALD oxide. In some embodiments, the optional oxide layer 109 may be applied subsequent to the optional trimming as illustrated in FIG. 4. In other embodiments, the optional oxide layer 109 may be applied even when the optional trimming is not performed.

Figure 6:
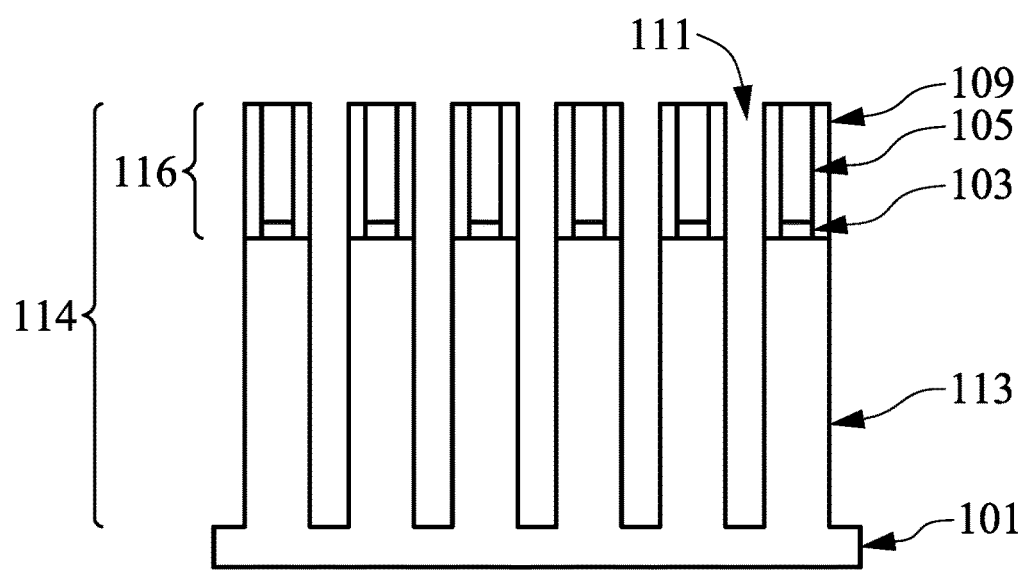

Referring to FIG. 6, the silicon substrate 101 is etched to form fins 114 and etched trenches 111. Fins 114 have a lower portion 113 made from the silicon substrate 101 and an upper portion 116 made from the stacked pad oxide 103 and pad nitride 105, with sidewalls made from and oxide recapping layer 109 (if used). In some embodiments the lower portion 113 can be between 70 nm and 150 nm tall. For example, the lower portion 113 can be about 100 nm tall. In some embodiments, fin heights can be taller than 150 nm or shorter than 70 nm. Although an anisotropic etch is desirable, which can more closely result in the rectangular fins 113 as illustrated in FIG. 6, one of skill in the art will understand that the fins 113 can have a taper to them, being narrower at the top and wider at the bottom. The topmost layer of the oxide layer 109 (if used) and hard mask 107 can be removed, for example by Chemical Mechanical Polish (CMP) process. In embodiments where the optional oxide layer 109 is used, the oxide layer 109 can remain on the side walls of the upper portion of the fin 116.

Figure 7:
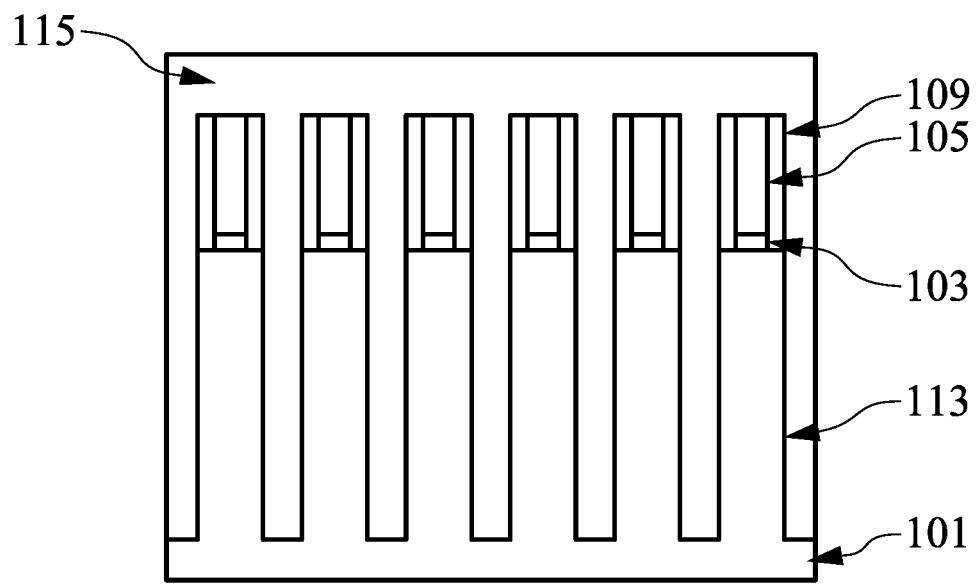

Referring to FIG. 7, in some embodiments a dummy gapfill material 115 can be used to fill in openings 111. In some embodiments, the dummy gapfill material 115 can completely encapsulate the fins, as illustrated. In other embodiments, the dummy gapfill material 115 can encapsulate portions of the fins. In some embodiments, the dummy gapfill material 115 can be planarized, for example by a CMP, so that the topmost surface of the dummy gapfill material is coplanar with the topmost surface of pad nitride layer 105.

Material that can be used as dummy gapfill material 115 includes material that is low stress and easy to remove.

Rather than use real (permanent) Shallow Trench Isolation (STI) oxide material, the dummy gapfill material 115 can be used. Such dummy gapfill material 115 may include forms of silicon carbonate (SiC), silicon oxycarbide (SiOC), a low-k dielectric material (such as SiO2, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers), or spin-on carbon (SOC).

Dummy gapfill material 115 can be applied through deposition, such as Sub Atomic Chemical Vapor Deposition (SACVD), Flowable Chemical Vapor Deposition (FCVD), Chemical Vapor Deposition (CVD), Atomic Layer Deposition (ALD), and the like. In some embodiments, dummy gapfill material 115 can be applied as a liquid and then cured, heated, or annealed. For example, in embodiments where dummy gapfill material 115 is SOC, the SOC material may be dispensed as a liquid, and may be formed from raw materials that include elements such as C, H, O, N, F, Br, and S. The SOC material may be between about 50% and about 95% carbon.

In some embodiments, the low quality material used as dummy gapfill material 115 is a low quality oxide, which is easy to remove and low stress. In some embodiments the low quality oxide can be STI oxide material that has been prepared with a procedure to produce a low quality oxide. For example, a low temperature thermal anneal can be used rather than a high temperature anneal to provide an STI oxide material of reduced stress and low quality.

Using low stress and easily removed material as dummy gapfill material 115 can reduce iso-dense stress difference. The dummy gapfill material 115 is later removed and replaced by real STI oxide after removing unwanted fins 113. If permanent (high stress) STI oxide material were used, after the fin cut and removal of unwanted fins, depositing high stress STI oxide material into the openings left behind can cause compressive effects and result in bending proximate fins, especially at their tips. The proximate fins being bent can cause other nearby fins to bend as STI oxide material between each of the neighboring fins can transfer the bend of one fin to the next fin.

Figure 8:
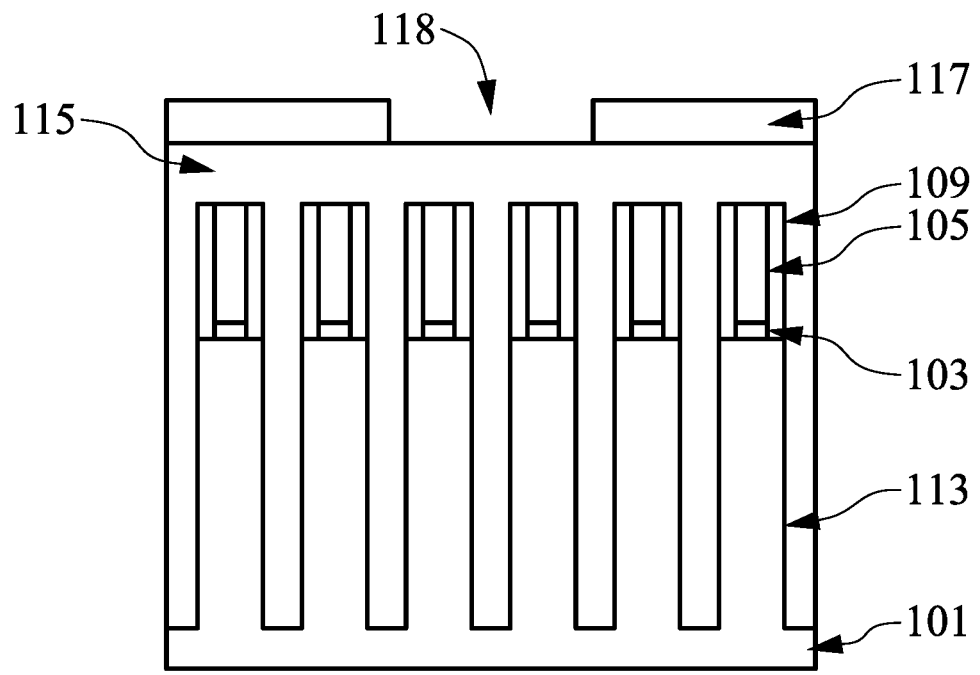

Referring to FIG. 8, photoresist material 117 can be deposited and patterned to form openings 118, the openings 118 corresponding to fins which will be removed in a cut-last process. Generally, photolithography techniques utilize a photoresist material (such as photo resist 117) that is deposited, irradiated (exposed), and developed to remove a portion of the photoresist material. The remaining photoresist material protects the underlying material, such as the dummy gapfill material 115, from subsequent processing steps, such as etching. In this example, the photoresist material is patterned to define the fins which will be removed. Photoresist material 117 is used as a fine cut pattern and then as an etch mask.

Figure 9:
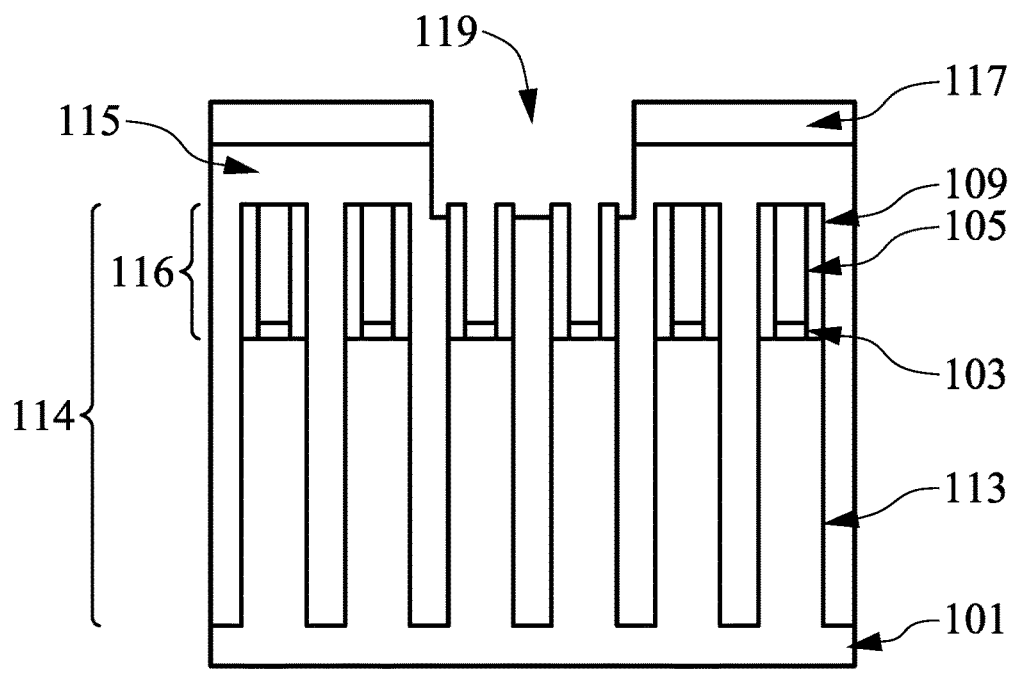

FIG. 9 illustrates the semiconductor structure after one or more fine cut processes have been applied. The one or more fine cuts can be performed using the photoresist material 117 as a fine cut pattern. Although illustrated as cuts along the length of the fin, cuts can also be applied transverse to the fins, so as to cut fins into fin segments by removing portions of fins between fin segments. One of skill in the art will also understand that one or more fins or fin segments can be removed. Thus, in some embodiments, an entire fin can be removed while in other embodiments, no fins will be removed, but one or more fin segments will be removed. The fine cut process will create openings 119 and expose the silicon fin 113 where the fin will be removed. The fine cut process can include a multi-step process to remove pad nitride layer 105 and pad oxide layer 103, which can be removed by a combination of techniques, using the fine cut pattern and selective etching due to the selectivity etching of pad nitride layer 105 and pad oxide layer 103.

Figure 10:
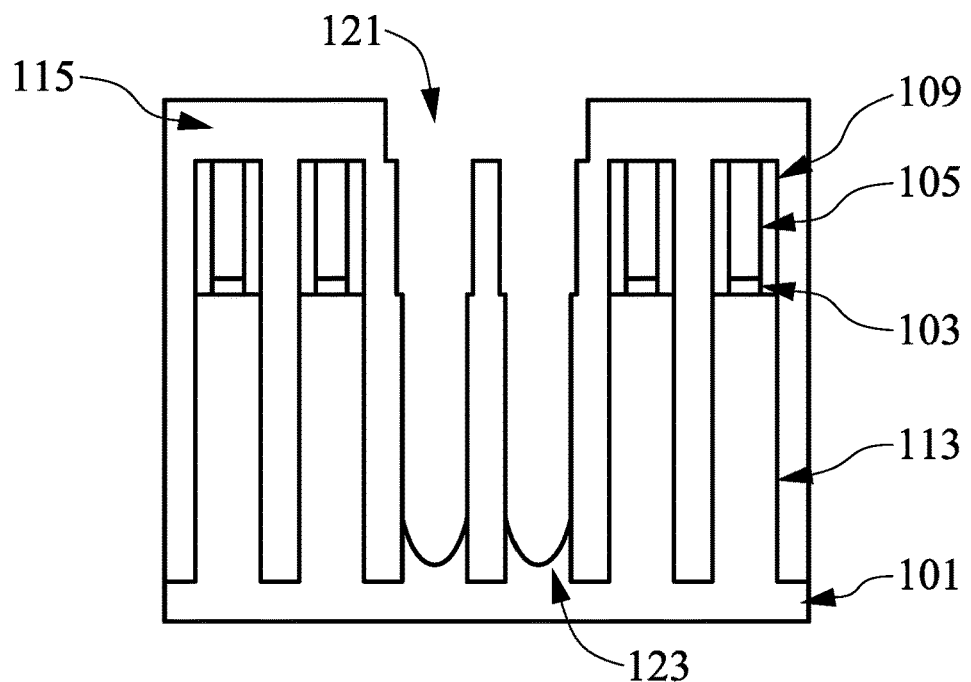

Referring to FIG. 10, an etchant is used to remove the silicon fin 113 where it was exposed through fine cut pattern/photoresist mask 117. In some embodiments, oxide recap layer 109 can be removed if used. In other embodiments, oxide recap layer 109 can remain. The etchant can include a wet etchant or a dry etchant. The etching process can include using a self-aligned etch. In some embodiments, the silicon etch can be chlorine gas (Cl$_2$) or hydrogen bromide (HBr), which are highly selective over dielectrics, such as silicon oxycarbide (SiOC), spin on carbon (SOC), and other oxides.

At the bottom of the fin 113, a portion 123 of fin 113 remains behind after etching. A topmost surface of the fin portion 123 can be contoured such that the center of the fin portion will have a top surface that is more recessed than the edges. In other words, in cross-section view the top surface of fin portion 123 can be concave. As a result, the fin portion 123 can also be referred to as a concave fin portion 123. For example, the cross-section shape can appear to be a u-shape or v-shape. In some embodiments, the concave fin portion 123 of fin 113 that remains behind can be about 5-30% of the original fin size. For example, in embodiments where the fin portion 113 is about 100 nm tall, the concave fin portion 123 can be about 20 nm tall. In some embodiments, the fin can be completely removed, leaving no concave fin portion 123 behind. In some embodiments, more than 30% of the fin portion 113 can remain behind as concave fin portion 123.

The etching process used can be a self-aligned etch to create openings 121. Although, the openings 121 are illustrated as being wider at the top than the bottom, in some embodiments, the opening 121 at the top (i.e., closer to the top surface of dummy gapfill material 115) is narrower than the opening 121 toward the bottom, near concave fin portion 123. In some embodiments, the opening 119 created in top portion 116 of the fin 114, will remain narrow as the openings 121 are created in etching. Accordingly, the opening 121 can start wide, narrow through the neck created at top fin portion 116 and then widen to the width of the fin bottom portion 113. Because the dummy gapfill material 115 is low stress material, the fins proximate to the openings 121 do not bend, whereas if the gapfill material 115 were high stress, such as with a real STI oxide material, the fins proximate to the openings 121 can bend away from the openings 121 due to high stress material.

Concave fin portion 123 of fin 113 remains behind. The concave fin portion 123 is created by etching within the dummy gapfill material 115. As the fin 113 is etched, etchant is concentrated at the center of the fin 113 so that the center is exposed to more etchant than the sides, resulting in a depression in the center causing a concavity in the upper surface of the fin 123. In a typical cut-last process, a fin might be removed by masking fins that will be kept without using a dummy gapfill material 115. The exposed fins can then be etched away. As such, whereas embodiments will produce a concave fin portion 123, in a typical cut-last process, any fin portion remaining would not have such a profile.

Figure 11:
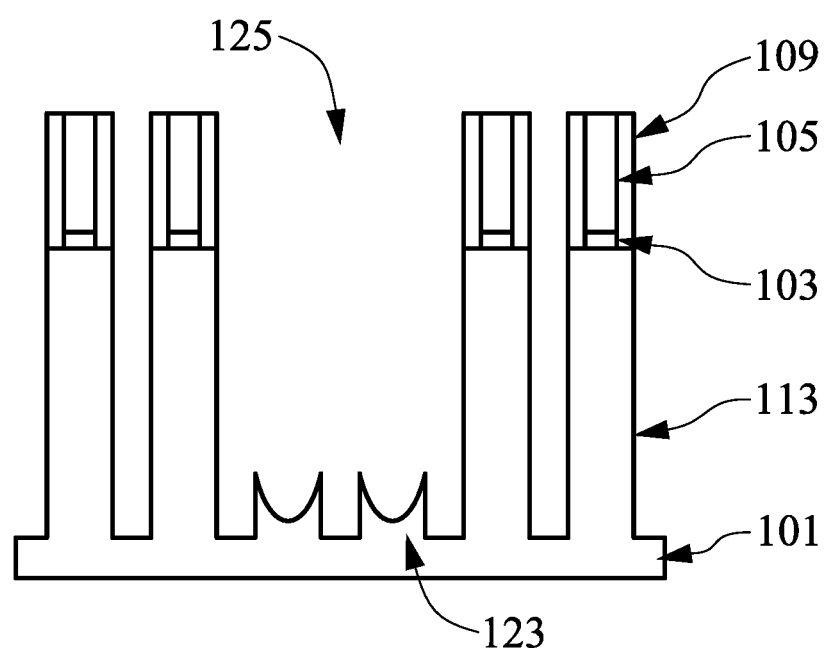

Referring to FIG. 11, in one embodiment, the dummy gapfill material 115 can be removed, resulting in the structure illustrated by FIG. 11. The dummy gapfill material 115 can be removed using an etchant. The etchant can include a wet etchant or a dry etchant. In some embodiments, the silicon etch can be an oxygen ($O_2$) plasma, $N_2H_2$ plasma, or other suitable etchant. Because the dummy gapfill material 115 is easily removed, an etchant can substantially remove all of the dummy gapfill material 115 without damaging other parts of the structure. Accordingly, the structure of FIG. 11 can represent a cut-last OD process.

Referring to FIG. 12, a permanent STI oxide material 127 can be formed over the semiconductor structure. In some embodiments, STI oxide material 127 can completely encapsulate the fins. Notably, the concave fin portion 123 of the removed silicon fins still remain and are also encapsulated by the STI oxide material. In FIG. 13, the STI oxide 127 can be planarized to be substantially coplanar at 129 with the top portion of the fin.

The fin structure of FIG. 13 can be further processed to have source/drain regions formed and one or more gate structures placed thereon. An interconnect can be attached to the fin structure to connect parts of the FinFET to other active devices. The FinFET structure can be singulated and undergo further processing.

Using a dummy gapfill material 115 has the benefit of allowing a cut-last process to be used on small manufacturing technologies and reduces the chance of fin bending that can result from high stress STI oxide material. For example, in some embodiments a two-step cut-last process can be used on technologies where the fins are less than 15 nm wide, such as about 8 nm. In other embodiments, a two-step cut-last process using dummy gapfill material can be used on technologies where fins are greater than 15 nm wide.

Figure 14:
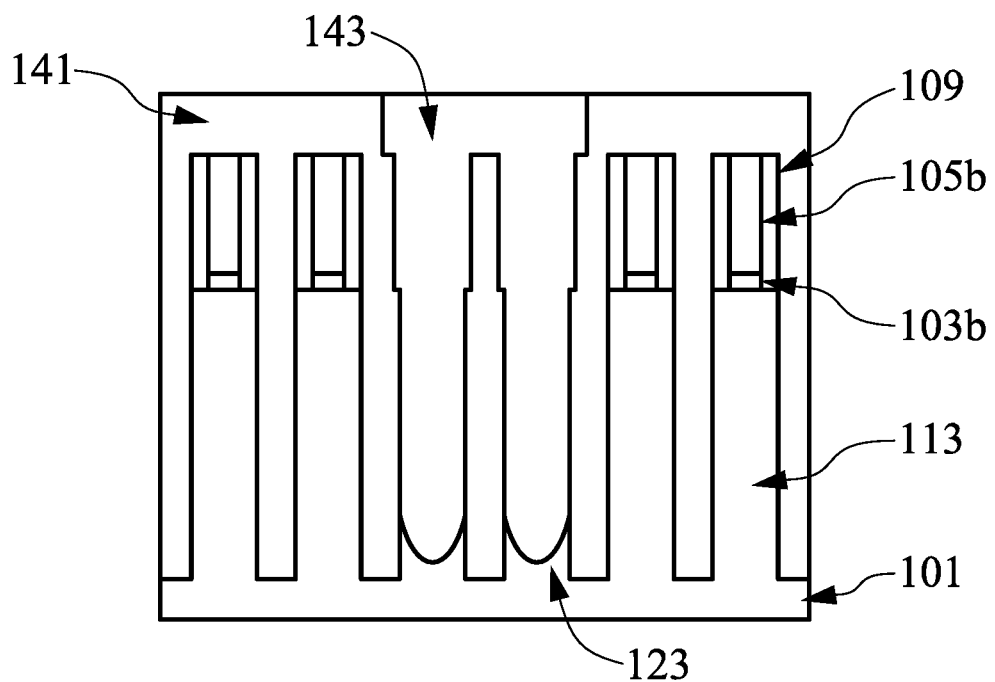

Referring to FIG. 14, following the process at FIG. 10, in some embodiments, rather than remove the low-quality STI oxide material, it can be converted into a high quality STI oxide material by exposing it to an additional thermal anneal, such as a high-temperature thermal anneal or a longer thermal anneal. For example, in embodiments where a low quality STI oxide material was formed with a low temperature anneal, a high temperature anneal can convert the low quality STI oxide to a high quality STI oxide, without removal of the oxide. Additional STI oxide material 143 can be deposited or formed in openings 121. In some embodiments, the additional STI oxide material 143 can be additional low quality STI oxide material and the structure can be further annealed to convert both the low quality STI oxide material 143 and the dummy gapfill material 115 into permanent STI oxide material 141/143. In other embodiments, the dummy gapfill material 115 can be converted into permanent STI oxide material 141, and then a high quality permanent STI material 143 can be used to fill openings 121. Materials 141 and 143 can be the same or different materials and can be deposited or formed as previously discussed in context with dummy gapfill material 115.

Converting a dummy gapfill material 115 into STI oxide material can help alleviate fin bending due to high stress STI oxide. Using a two-step cut-last process also has the benefit of allowing a cut-last process to be used on small manufacturing technologies. For example, in some embodiments a two-step cut-last process can be used on technologies where the fins are less than 15 nm wide, such as about 8 nm. In other embodiments, a two-step cut-last process using converted dummy gapfill material can be used on technologies where fins are greater than 15 nm wide.

Referring again to FIG. 14, in some embodiments where a dummy gapfill material is not used, permanent STI oxide can be used in a two-step cut-last process. In such embodiments, the concave fin portion 123 will be left behind in the STI oxide, such as discussed above. In such embodiments, following the process at FIG. 10, the material 115/141 can be considered a permanent STI oxide material. The openings 121 left behind by the removal of the silicon fin portion 113 can be filled with additional permanent STI oxide material 143 or filled with STI oxide material that is then made permanent through curing, heating, or annealing. STI oxide material 143 can be applied in multiple steps through deposition, such as Sub Atomic Chemical Vapor Deposition (SACVD), Flowable Chemical Vapor Deposition (FCVD), Chemical Vapor Deposition (CVD), Atomic Layer Deposition (ALD), and the like. In some embodiments, dummy gapfill material 115 can be applied as a liquid and then cured, heated, or annealed. Although using a two-step cut-last process with STI oxide material can result in fin-bending, the two-step last cut process has the benefit of allowing a cut-last process to be used on small manufacturing technologies. For example, in some embodiments a two-step cut-last process can be used on technologies where the fins are less than 15 nm wide, such as about 8 nm. In other embodiments, a two-step cut-last process using STI oxide can be used on technologies where fins are greater than 15 nm wide.

Figure 15:
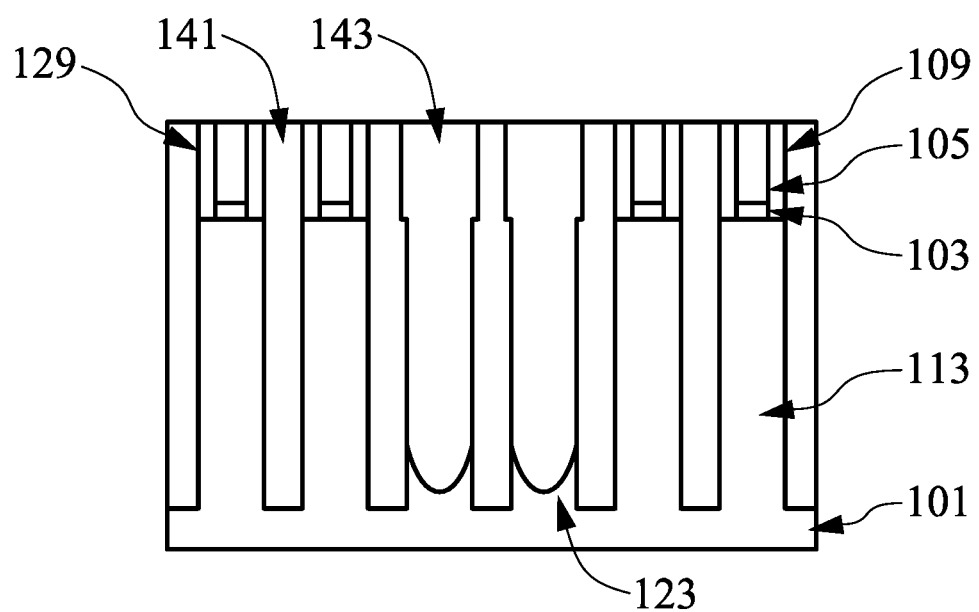

Referring to FIG. 15, next the STI oxide 141 and 143 can be planarized to be substantially coplanar at 129 with the top portion of the fin. The fin structure of FIG. 15 can be further processed to have source/drain regions formed and one or more gate structures placed thereon. An interconnect can be attached to the fin structure to connect parts of the FinFET to other active devices. The FinFET structure can be singulated and undergo further processing.

Embodiments of the present disclosure can provide a cut-last process for cutting fin segments of a FinFET structure on a substrate. Utilizing a two-step process can allow a cut-last process to be used on smaller fin technologies, where a cut-first process might ordinarily be required. After the fins are formed, a material is deposited in the trenches of the FinFET structure. In some embodiments, the material is STI oxide. STI oxide is typically high stress and can cause fin bending to fins proximate to a fin in the process of removing a fin segment. In some embodiments, the material deposited is a dummy gapfill material. The dummy gapfill material can be a low-stress oxide. Using a dummy gapfill material can help prevent fin bending that can be caused if using an STI oxide. In some embodiments, the dummy gapfill material can be an STI oxide that is subjected to a low-temperature anneal or is otherwise not fully formed or processed so that the STI oxide remains low stress. A fine-cut is made and the fin or fin segment is removed by an etchant and can leave a concave portion of silicon at the bottom of the fin. In embodiments using STI oxide, the void left by removing the fin can be filled with replacement STI oxide. In embodiments using a dummy gapfill material, in some embodiments the dummy gapfill material can be removed and replaced with an STI oxide, while in other embodiments, the void can be filled with an STI oxide material and the dummy gapfill material converted to an STI oxide material.

In some embodiments, a method includes selectively etching a substrate to form fins and trenches. The trenches are then filled with a first oxide. One of the fins, a first fin, is etched to remove at least a portion of the first fin, thereby forming a void. The void can be filled with a second oxide that can be the same as the first oxide or different from the first oxide.

In some embodiments, a method includes selectively etching a substrate to form a plurality of fins and trenches. The trenches are then filled with a dummy gapfill oxide. A fine cut is performed on a first fin of the plurality of fins. The first fin is then etched to remove at least a portion of the first fin. Next, the dummy gapfill oxide is removed and replaced with an STI oxide in the trenches and over the first fin.

In one embodiment, a FinFET structure includes a substrate having a lower continuous portion and a plurality of fins above the continuous portion. The plurality of fins includes at least one shortened fin. The other fins that are not shortened are full fins. The shortened fin is shorter than a full fin. The shortened fin has an uppermost surface that is concave in cross-section view. An STI oxide material is disposed in a trench between two of the plurality of fins.

In an embodiment, a device includes first fins extending vertically from a substrate by a first distance and second fins extending vertically from the substrate by a second distance, the second distance being less than the first distance, the second fins being adjacent the first fins, where each of the first fins and the second fins include a semiconductor material and are disposed in a lengthwise direction parallel to each other. The device also includes a first shallow trench isolation (STI) region disposed between the first fins and the second fins. The device further includes a second STI region disposed over and on the second fins and surrounded by the first STI region, the second STI region having a different material composition than the first STI region, sidewalls of the second STI region having an interface with the first STI region.

In another embodiment, a structure includes a substrate having a lower continuous portion and a plurality of fins above the lower continuous portion, the plurality of fins including a short fin and two full fins, the short fin being shorter than the two full fins, the short fin being disposed adjacent to the two full fins. The structure includes a first shallow trench isolation (STI) material disposed between the two full fins. The structure also includes a second STI material disposed on an uppermost surface of the short fin, the second STI material being surrounded by the first STI material, the second STI material having a different stress characteristic than the first STI material.

In another embodiment, a device includes a first semiconductor fin protruding from a substrate by a first distance, the first semiconductor fin laterally surrounded by a first insulating material, the first insulating material having a first stress. The device also includes a second semiconductor fin protruding from the substrate by a second distance, the second distance less than the first distance, the second semiconductor fin laterally surrounded by the first insulating material. The device further includes a second insulating material disposed over an upper surface of the second semiconductor fin, the second insulating material having a second stress different than the first stress, the second insulating material laterally surrounded by the first insulating material, where an upper portion of the second insulating material is wider than a lower portion of the second insulating material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   first fins extending in a vertical direction from a substrate by a first distance, the vertical direction perpendicular to the substrate;
   second fins extending in the vertical direction from the substrate by a second distance, the second distance being less than the first distance, the second fins being adjacent the first fins, wherein each of the first fins and the second fins comprise a semiconductor material and are disposed in a lengthwise direction parallel to each other, wherein a bent fin of the first fins which is adjacent to the second fins is bent over from the vertical direction about a bending moment, a width of an upper portion of the bent fin being inclined from the vertical direction away from the second fins;
   a first shallow trench isolation (STI) region disposed between the first fins and the second fins, the first STI region having a uniform composition; and
   a second STI region disposed over and on the second fins and surrounded by the first STI region.

2. The device of claim 1, wherein an upper surface of the first STI region and an upper surface of the second STI region are level with each other.

3. The device of claim 1, wherein a first portion of the first STI region is disposed between two fins of the second fins, wherein the first portion of the first STI region is disposed in a lengthwise direction parallel to the second fins.

4. The device of claim 1, wherein a lateral stress property of a material composition of the first STI region has a first stress characteristic, wherein a lateral stress property of a material composition of the second STI region has a second stress characteristic, different from the first stress characteristic.

5. The device of claim 1, wherein upper surfaces of the second fins are concave.

6. The device of claim 1, wherein a first portion of the second STI region is disposed over a short fin of the second fins, wherein the first portion of the second STI region is thickest over a middle of the short fin.

7. The device of claim 1, wherein the first STI region laterally surrounds and contacts a first short fin of the second fins, wherein the first STI region laterally surrounds and contacts the second STI region, wherein a first continuous vertical interface of the first STI region and the second STI region has bottom point that intersects with an upper surface of the first short fin, wherein a second continuous vertical interface between the first STI region and the first short fin has an upper point that interests with the upper surface of the first short fin, and wherein the first continuous vertical interface and the second continuous vertical surface extend along a same line in a cross-section view.

8. A structure comprising:
   a substrate having a lower continuous portion and a plurality of fins above the lower continuous portion, the plurality of fins comprising a short fin and two full fins, the short fin being shorter than the two full fins, the short fin being interposed between the two full fins;
   a first shallow trench isolation (STI) material disposed between the two full fins and laterally surrounding sidewalls of the short fin, the first STI material comprising a single material; and a second STI material disposed on an uppermost surface of the short fin, the second STI material being completely laterally surrounded by and in contact with the first STI material, wherein the second STI material has a continuous vertical face, the continuous vertical face interfacing with the first STI material along a continuous vertical interface for its entire length, wherein a bottom of the continuous vertical interface coincides with the uppermost surface of the short fin, wherein a top of the continuous vertical interface coincides an uppermost surface of the second STI material, the second STI material having a second stress characteristic which is different than a first stress characteristic of the first STI material.

9. The structure of claim 8, wherein the short fin has an uppermost surface that is concave in cross-section view.

10. The structure of claim 8, wherein the short fin is a first short fin, wherein the plurality of fins further comprises a second short fin adjacent the first short fin, further comprising:
a third STI material having a same material composition as the second STI material, the third STI material disposed on an uppermost surface of the second short fin, a thickest portion of the third STI material being disposed over a side-to-side middle of the second short fin, a lengthwise strip of the first STI material being interposed between the second STI material and the third STI material.

11. The structure of claim 8, wherein the first STI material and the second STI material are different materials.

12. The structure of claim 8, wherein the first STI material comprises one or more of silicon carbonate, silicon oxycarbide, or silicon oxide.

13. The structure of claim 8, wherein the first STI material comprises one or more of SiOCH, borophosphosilicate glass, fluorinated silicate glass, or undoped silicate glass.

14. The structure of claim 8, wherein a first fin of the two full fins is adjacent to the short fin, wherein a width of the first fin is bent over from a vertical direction about a bending moment, the vertical direction perpendicular to the substrate.

15. The structure of claim 8 wherein an interface between the first STI material and the short fin extends continuously from and in line with the continuous vertical interface.

16. The structure of claim 8, wherein the first stress characteristic of the first STI material is a characteristic of a material composition of the first STI material, and wherein the second stress characteristic of the second STI material is a characteristic of a material composition of the second STI material, wherein the first STI material and the second STI material are comprised of the same elements.

17. A device comprising:
a first semiconductor fin protruding from a substrate by a first distance;
a first insulating material laterally surrounding the first semiconductor fin, the first insulating material being homogeneous, the first insulating material having a material property including a first lateral stress, the first lateral stress exhibited on the first semiconductor fin;
a second semiconductor fin protruding from the substrate by a second distance, the second distance less than the first distance, the second semiconductor fin laterally surrounded by the first insulating material, wherein sidewalls of the second semiconductor fin have a first interface with the first insulating material; and
a second insulating material disposed over an upper surface of the second semiconductor fin, the second insulating material being the same material as the first insulating material, the second insulating material having a material property including a second lateral stress which is different than the first lateral stress, the second insulating material laterally surrounded by the first insulating material, the second insulating material having a second interface with the first insulating material, the second interface extending continuously from an upper surface of the second insulating material to an upper surface of the second semiconductor fin, wherein the first interface extends from the second interface along a same line as the second interface in a cross-section view.

18. The device of claim 17, wherein the first semiconductor fin is adjacent the second semiconductor fin, wherein a width of the first semiconductor fin is bent over from a first direction about a bending moment, the first direction being normal to the substrate.

19. The device of claim 18, wherein a lower surface of the second insulating material is convex, wherein a thickness of the second insulating layer over the second semiconductor fin is greatest at a side-to-side center of the second semiconductor fin.

20. The device of claim 18, further comprising a third semiconductor fin adjacent the first semiconductor fin, the third semiconductor fin protruding from the substrate by the first distance, wherein a fin pitch between the first semiconductor fin and the second semiconductor fin is the same as a fin pitch between the first semiconductor fin and the third semiconductor fin.

* * * * *